United States Patent [19]
Jankowski

[11] 3,764,862
[45] Oct. 9, 1973

[54] LEAD FRAME FOR LIGHT-EMITTING DIODES

[75] Inventor: Alfred S. Jankowski, San Jose, Calif.

[73] Assignee: Fairchild Camera and Instrument Corporation, Mountain View, Calif.

[22] Filed: Oct. 19, 1972

[21] Appl. No.: 298,908

[52] U.S. Cl. ...... 317/234 R, 317/234 E, 317/234 N, 317/235 N, 313/108 D

[51] Int. Cl. ............................ H01l 3/00, H01l 5/00

[58] Field of Search ......................... 317/234, 3, 3.1, 317/5.4, 235, 27; 313/108 D; 174/DIG. 3

[56] References Cited

UNITED STATES PATENTS

| | | | |
|---|---|---|---|
| 3,609,475 | 9/1971 | Kaposhilin | 317/234 E |
| 3,676,668 | 7/1972 | Collins et al. | 317/234 F |
| 3,694,902 | 10/1972 | Apgar et al. | 174/DIG. 3 |

*Primary Examiner*—John W. Huckert
*Assistant Examiner*—Andrew J. James
*Attorney*—Roger S. Borovoy et al.

[57] ABSTRACT

A lead frame strip for light-emitting diodes containing a plurality of lead pairs, one lead of each pair having a portion in a plane perpendicular to the plane of the strip containing an integral reflective cavity in which the light-emitting diode die is mounted.

12 Claims, 3 Drawing Figures

LEAD FRAME FOR LIGHT-EMITTING DIODES

FIELD OF THE INVENTION

This invention relates to a lead frame for low cost, rapid assembly of light-emitting diodes. These diodes are assembled by attaching the diode die to one lead of a lead pair on a metal strip having a pluraltiy of lead pairs. After attachment of the die, a wire is attached from the top surface of each diode to the other lead of each lead pair. Next, each pair of leads is encapsulated in a plastic encapsulation material which also serves as a lens. Finally, the leads are mechanically separated to form separate devices each having two independent leads connected to the encapsulated device.

PRIOR ART

In prior art, when lead frames were employed for light-emitting diode assembly requiring a reflector, a two-piece assembly unit had been used. The first piece is a conventional lead frame, normally flat with no cavity. The light-emitting diode die is first mounted in a separate cup-like cavity member. This cavity member is then attached to a conventional lead frame which is normally flat and without a cavity. Extra steps were required for the attachment of the separate parts; automated assembly was found to be difficult using the prior art two-piece technique because of difficulty of alignment of the cup and frame.

BRIEF DESCRIPTION OF THE INVENTION

In the subject invention, a lead frame strip is employed in the manufacture of light-emitting diodes which has an integral, reflective cavity. This integral cavity serves both as a reflector and a means for locating the die in each center of one lead. Briefly, the lead strip for light-emitting diodes of the invention includes a metal strip containing a plurality of lead pairs in the same longitudinal plane, one lead of each pair having an exposed surface area at one end thereof in a longitudinal plane perpendicular to the longitudinal plane of the remainder of the strip; and an integral reflective cavity formed in that surface area extending from the exposed surface area partially into the lead, the cavity having a substantially flat bottom, and having walls which extend outwardly from this bottom to the surface area of the lead at an angle between about 120° and 150° with the bottom, the cavity being adapted to contain the light-emitting diode die.

The light-emitting diode die is mounted on the flat bottom of the cavity. Preferably, the upper surface of the flat die is substantially coplanar with the surface area of the lead. In that way, the die is mounted totally within the lead, and the walls of the cavity serve to reflect any light emitted from the sides of the die. If the angle between the cavity walls and the bottom is 135°, the light from the sides of the die is reflected through a 45° angle and therefore is reflected in a line perpendicular to the plane of the bent surface area of the lead frame strip. This provides maximum light output.

After the die is attached to the bottom of the cavity in a conventional manner, such as by soldering, a wire is attached between the top of each die positioned in each cavity of a bent lead and the other lead of the same lead pair. Next, the die and the tops of both leads of each pair of leads are encapsulated in a plastic material which serves both to protect the leads and the die and to act as a lens for the light-emitting diode. Finally, the strip is mechanically severed into individual devices, forming two electrically separate leads for each separate device.

COMPLETE DESCRIPTION OF THE INVENTION

Figures 1, 2, 3:
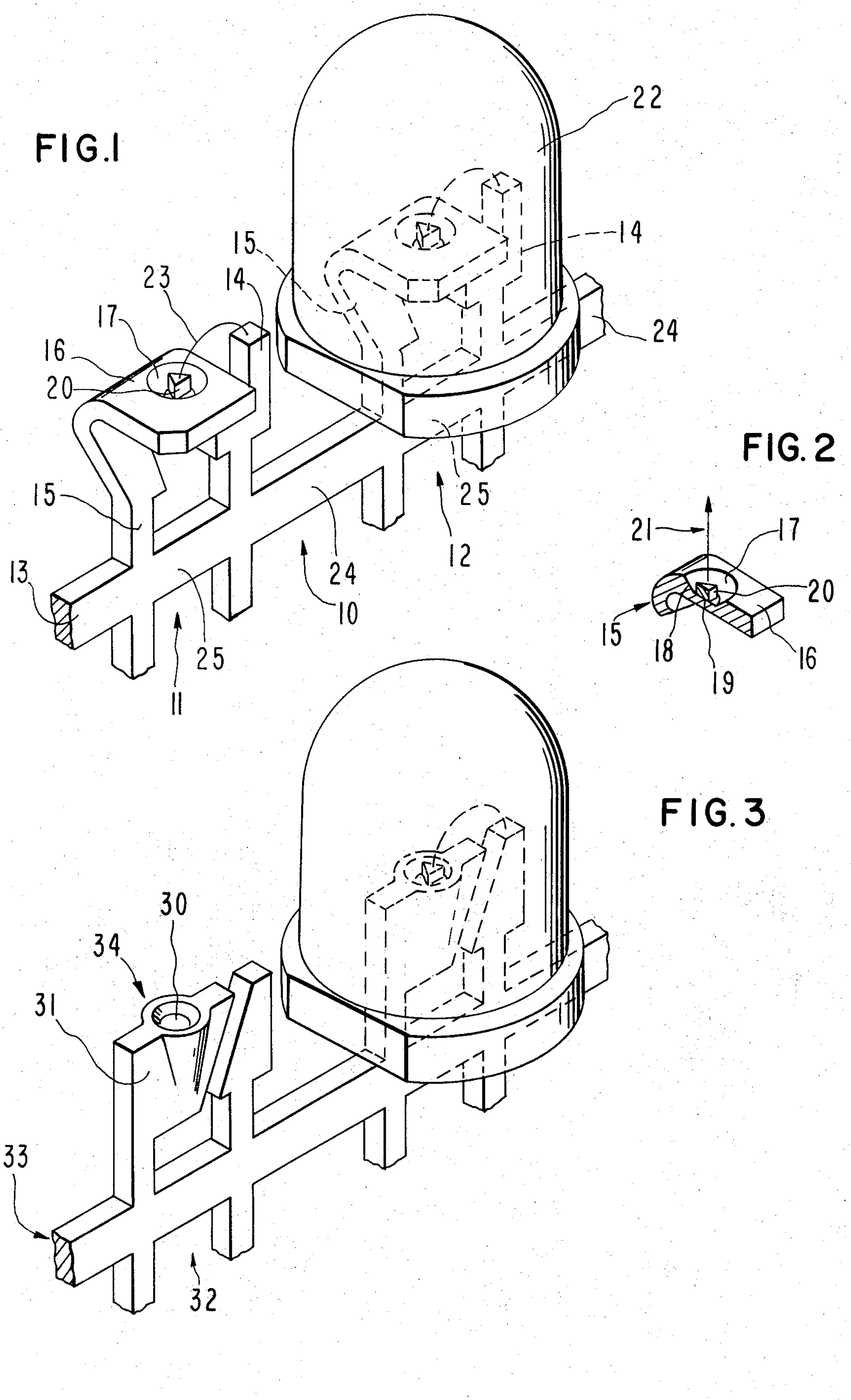
FIG. 1 is a pictorial view of a section of a lead frame strip of one emboidment of the invention, showing one device completed but unencapsulated, and another device completed including the encapsulation.
FIG. 2 is a pictorial cross-section through one lead showing the bent lead, the cavity, and the die mounted in the caivty.
FIG. 3 is a pictorial view of a section of a lead frame of another embodiment of the invention showing one device completed and encapsulated.

FIG. 1 shows a lead frame strip 10 in accordance with the invention. The strip includes a plurality of lead pairs 11 and 12 connected by a tie bar 13 so that a large number of lead pairs such as pairs 11 and 12 can be handled in a simultaneous, mass production assembly operation. Tie bar 13 will later be removed after the devices have been completed to form independent devices, and two independent leads of each independent device. The lead frame strip is formed from a conductive metal, preferably by stamping or punching. Various types of metals are suitable, preferably Kovar, which is an alloy of copper, nickel and iron, or various commercially available copper-iron alloys such as Olin-194. Where a copper-iron alloy is employed, the lead frame strip of the invention is preferably plated with nickel, for example a thin, 100 microinch layer over the entire frame. The thickness of the frame can by anywhere from 10 to 50 mils, 12 to 30 mils thickness being preferable. The thickness varies with the type and size of the device being manufactured.

Each device to be fabricated on the strip 10 must contain two leads called a lead pair. Each of lead pairs 11 and 12 includes a straight lead 14 and a bent lead 15. As is seen in FIG. 1, the plurality of lead pairs 11 and 12 are in the same longitudinal plane which passes through the straight portions of lead pairs 11 and 12 through the tie bar portion 13. Lead 15 is bent so as to expose a surface area thereof 16 called the "exposed surface area 16" in a longitudinal plane which passes through surface area 16 and is perpendicular to the longitudinal plane of the remainder of the strip.

Within surface area 16 is formed a cavity 17 as shown in FIGS. 1 and 2 extending from the surface area 16 partially into the lead 15. As best seen in FIG. 2, the cavity has a substantially flat bottom 19 and walls 18 which extend outwardly from the bottom to the surface area 16 at an angle between about 120° and 150° with the bottom 19. This cavity 17 is adapted to contain the light-emitting diode die 20 which is mounted on the bottom 19. This cavity is made reflective in a manner to be discussed later.

Preferably, the angle between cavity walls 18 and flat bottom 19 is 135°. In that manner, light emitting from the sides of diode die 20 is reflected off the cavity walls in a direction shown by arrow 21 in FIG. 2, which is perpendicular to the surface area 16 of the bent portion of lead 15. In a preferred embodiment of the invention, the aperture of cavity 17 at the surface over 16 is circular.

In order to make the cavity more relfective, at least the entire interior of the cavity, and sometimes the entire surface area 16 of lead 15 is coated with a reflective metal. Gold has been found to do a very good job because it is one of the most highly reflective metals, and in addition provides a good means of secure attachment by soldering of the die 20 to the bottom surface 19 of cavity 17. The thickness of the gold should be kept to a minimum, just enough to provide a uniform coating and to provide secure attachment of the die to the cavity bottom. For this purpose, between 50 and 200 microinches, preferably about 100 microinches has been found to be satisfactory. However thinner layers can be used if a gold coating is plated onto the backside of the die 20 prior to attachment.

Preferably, the die 20 is gallium phosphide because gallium phosphide emits light both from its sides and from its top. For gallium phosphide, the 135° angle between the cavity walls 18 and the cavity bottom 19 provides maximum forward reflection of the side-emitted light in the direction of arrow 21. However, the lead frame of the invention is not normally emitted from the sides of that type of device. Cavity 17 of the invention still serves the function of providing an easy means of locating the die 20 at the exact center of the lead frame during attachment. Central location of the die is extremely important because if the die is off-center, maximum light will not be emitted through the cap and lens 22, as shown in FIG. 1.

The depth of cavity 17 is normally approximately equal to the thickness of the die 20. In this way, the top surface of die 20 is substantially coplanar with surface area 16 and all of the light emitted from the sides of a gallium phosphide die will be reflected from the walls of the cavity. There is no reason to make the cavity any deeper because a deeper cavity requires a thicker and more costly lead frame. If the top surface of the die extends above the plane of surface area 16, a portion of the side-emitted light from the die 20 will not be reflected in the direction of arrow 21 and hence be lost. Typical examples of die thickness is 6 to 10 mils. Typical diameters of cavity 20 is 20–50 mils, preferably about 30 mils.

Die 20 which has a flat bottom and a flat top is soldered to the bottom 19 of cavity 17 using conventional die-attachment techniques, such as soldering of the die to the gold coating on cavity bottom 19. Next a wire 23 is attached between the top surface of die 20 and the other lead 14 of lead pair 11. This wire is bonded using conventional wire-bonding techniques. The use of the cavity of this invention for locating the die results in a uniform die location for each device on the strip 10. Accordingly, with such uniform exact die locations, high speed, repeatable automatic wire bonding with minimum operator observation and action is made possible. In strips of the prior art, using two-piece construction, the die location varies from device to device on the same strip and automatic wire bonding without operator alignment has not thus far been possible.

The final step in the assembly operation is the encapsulation of each device in plastic. This can be readily accomplished by placing a pluralty of plastic cups 22, as shown in FIG. 1, in a jig. The spacing between these cups in the jig corresponds to the spacing on the lead frame strip 10 between lead pairs 11 and 12. These plastic cups, which may for example be polyproplylene, are filled with a liquid plastic such as epoxy. The cups act as a mold for the epoxy. Depending on the desired application, both the cups and the liquid epoxy can be clear, red, frosted, or any other color or composition required. Once the strip is centered in the jig containing a row of cups, it is held there, and placed in a curing oven at a temperature required to cure the liquid plastic material. For example, using epoxy, a curing cycle for 20 to 30 minutes at 150° is satisfactory.

After the units have been cured, they are removed from the mold and the tie bar 13 is removed to isolate the independent devices formed from lead pairs 11 and 12 shown in FIG. 1, as well as to electrically separate the independent leads 14 and 15 of each device. To accomplish that result, it is necessary not only to remove the portions 24 of tie bar 13 which are located between lead pairs 11 and 12, but also the portions 25 of tie bar 13 which are located between the individual lead pairs 14 and 15 themselves. These portions are removed by punching or stamping. As is well known in the art, this may be done in one step, or in more than one step with a testing operation being carried out while the devices are still aligned as they were on the strip. In any event, the devices are finally tested and sorted in accordance with the test results.

Another emboidment of the invention is shown in FIG. 3. In this embodiment, cavity 30 is formed inwardly from the exposed surface area 34 of lead 31 of lead pair 32 on the lead frame strip 33. As shown, lead 31 is formed somewhat thicker near the exposed surface area 34 in order to make room for cavity 30. The depth and shape of cavity 34 is the same as previously described for cavity 17 in lead 15 of FIG. 1.

I claim:

1. A lead frame strip for light-emitting diodes comprising:

a unitary, one piece metal strip having a substantially uniform thickness except in the area of the cavities and containing a plurality of lead pairs in the same longitudinal plane, one lead of each pair having an exposed surface area at one end thereof in a longitudinal plane perpendicular to said longitudinal plane of the remainder of said strip; and an integral reflective cavity formed in each of said surface areas wholly within said one lead extending from said exposed surface area partially into said lead, the exterior walls of said cavity being tapered, the portion of said cavity wall having the largest cross-sectional area being at said one end of said one lead and becoming narrower along said lead in a direction away from said one end, a portion of each of said cavity walls being thicker than the substantially uniform thickness of the remainder of said strip, the outward angle of said walls from the bottom to said surface area being between about 120° and 150° with said bottom, said cavity being adapted to contain a light-emitting diode die.

2. The lead frame strip of claim 1 further characterized by being fabricated of an alloy of copper and iron.

3. The lead frame strip of claim 1 further characterized by said strip being punched.

4. The lead frame strip of claim 1 further characterized by having a thickness between about 10 and 50 mils.

5. The lead frame strip of claim 1 further characterized by said cavity having a circular aperture at said surface.

6. The lead frame strip of claim 1 further characterized by said angle of the cavity walls being about 135°.

7. The lead frame strip of claim 1 further characterized by the addition of a coating of a reflective metal over substantially the entire interior of said cavity.

8. The lead frame strip of claim 7 further characterized by said coating being a thin layer of gold.

9. The lead frame strip of claim 8 further characterized by the thickness of said gold layer being between about 50 and 200 microinches.

10. A combination of lead frame strip and a light-emitting diode mounted in each of a plurality of cavities thereon comprising:

a unitary, one piece metal strip having a substantially uniform thickness except in the area of the cavities and containing a plurality of lead pairs in the same longitudinal plane, one lead of each pair having an exposed surface area to one end thereof in a longitudinal plane perpendicular to said longitudinal plane of the remainder of said strip;

an integral reflective cavity formed in each of said surface areas wholly within said one lead extending from said exposed surface area partially into said lead, the exterior walls of said cavity being tapered, the portion of said cavity wall having the largest cross-sectional area being at said one end of said one lead and becoming narrower along said lead in a direction away from said one end, a portion of each of said cavity walls being thicker than the substantially uniform thickness of the remainder of said strip, the outward angle of said walls from the bottom to said surface area being between about 120° and 150° with said bottom; and a light-emitting diode die having two substantially flat surfaces mounted by a first of said flat surfaces in each of said cavities.

11. The combination of claim 10 further characterized by the other of said flat surfaces of each of said diode dice being substantially coplanar with said exposed surface area on said lead.

12. The combination of claim 10 further characterized by a wire extending from the other of said flat surfaces of each of said diode dice to the other lead of said lead pairs.

* * * * *